United States Patent
Park et al.

(10) Patent No.: US 6,867,076 B2
(45) Date of Patent: Mar. 15, 2005

(54) LIQUID CRYSTAL DISPLAY FOR PREVENTING GALVANIC PHENOMENON

(75) Inventors: Yong-In Park, Seoul (KR); Sang-Gul Lee, Seoul (KR); Jae-Beom Choi, Taejon (KR); Jong-Hoon Yi, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 12 days.

(21) Appl. No.: 10/396,333

(22) Filed: Mar. 26, 2003

(65) Prior Publication Data

US 2003/0183820 A1 Oct. 2, 2003

Related U.S. Application Data

(62) Division of application No. 09/435,579, filed on Nov. 8, 1999, now Pat. No. 6,570,183.

(30) Foreign Application Priority Data

Dec. 21, 1998 (KR) .............................. 98-56785

(51) Int. Cl.⁷ .......................... H01L 21/00; H01L 21/84
(52) U.S. Cl. .................. 438/149; 438/151; 438/722
(58) Field of Search .......................... 438/48, 128, 149, 438/151, 722; 257/59, 72

(56) References Cited

U.S. PATENT DOCUMENTS

| 5,422,921 A | * | 6/1995 | Chiba ........................... 378/34 |
| 5,434,439 A | | 7/1995 | Ajika et al. .................. 257/309 |
| 5,847,410 A | | 12/1998 | Nakajima ..................... 257/59 |

FOREIGN PATENT DOCUMENTS

| JP | 8-062628 A | 3/1996 |
| JP | 9-203911 A | 8/1997 |

* cited by examiner

*Primary Examiner*—Hoai Pham
(74) *Attorney, Agent, or Firm*—Birch, Stewart, Kolasch & Birch, LLP

(57) ABSTRACT

A thin film transistor having a source/drain electrode on an insulating substrate is provided with a metal oxide layer interposed between a source/drain electrode and a metal connecting line. The formation of the metal oxide layer prevents the occurrence of the galvanic phenomenon.

16 Claims, 5 Drawing Sheets

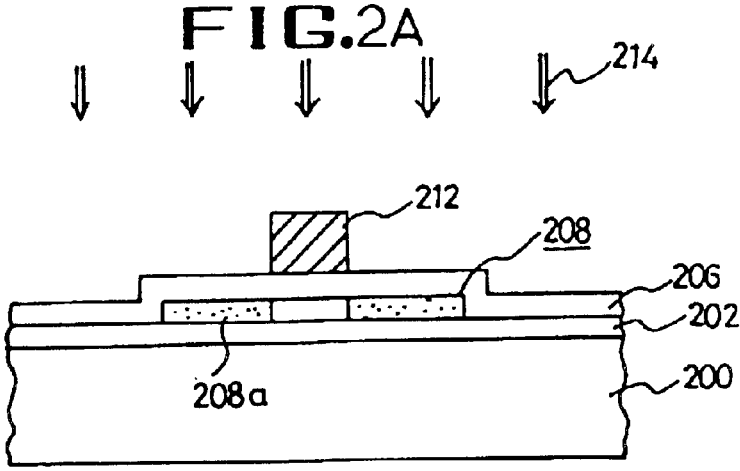
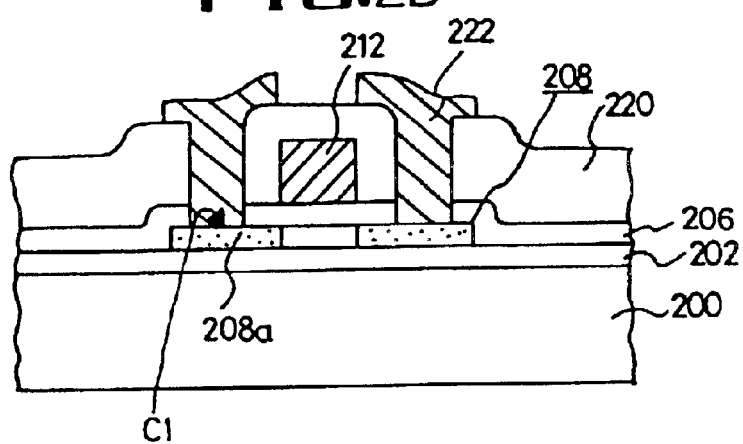
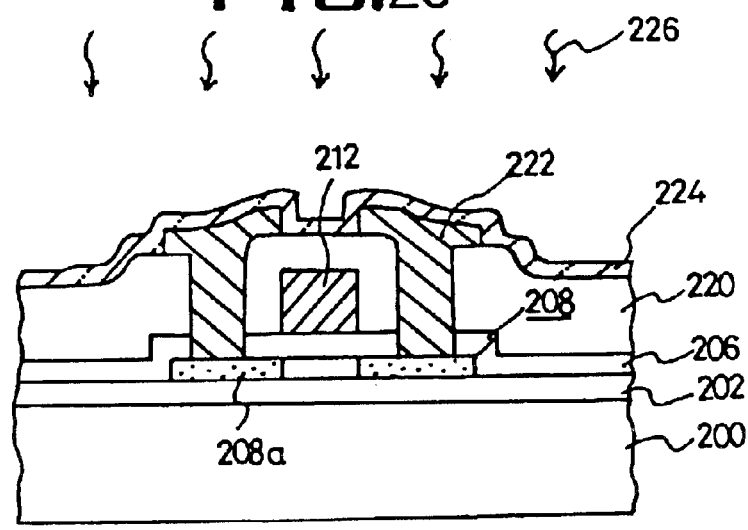

LIQUID CRYSTAL DISPLAY FOR PREVENTING GALVANIC PHENOMENON

This is a divisional of application Ser. No. 09/435,579 filed Nov. 8, 1999, now U.S. Pat. No. 6,570,183.

BACKGROUND OF THE INVENTION

1. Field of the Invention

The present invention relates to a method of manufacturing and structure of a liquid crystal display device. More specifically, the present invention relates to a method for manufacturing and structure of a liquid crystal display device that prevent the occurrence of the galvanic phenomenon, which occurs when a source/drain electrode formed of metal contacts a pixel electrode formed of ITO (Indium Tin Oxide).

2. Description of the Background Art

Amorphous silicon (a-Si) TFT LCDs (Thin Film Transistor Liquid Crystal Displays) are increasingly being used in more diverse applications such as notebook PCs and desk top monitors. The growth of the TFT-LCD industry along with wider acceptance of TFT-LCD related applications have occurred because of the improvements in screen resolution and screen size of TFT LCDs. Further, the key to sustaining this growth trend is manufacturing TFT LCDs with greater productivity so that the price of TFT LCDs becomes more affordable to consumers. To realize significant gains in productivity, the manufacturing process must be simplified, and this can only occur if there is cooperation among all those involved in the manufacture of LCDs.

FIGS. 1A–1C are cross-sectional views illustrating a process for manufacturing a LCD according to the related art.

Referring to FIG. 1A, a buffer layer 102 is formed on an insulating substrate 100 such as glass. Thereafter, polysilicon is deposited on the buffer layer 102. The polysilicon is then patterned by etching a selected portion so that the patterned polysilicon forms an active layer 108. Alternatively, the active layer 108 may be formed by depositing amorphous silicon and then crystallizing it using laser radiation. Thereafter, a gate insulating layer 106 is formed on the buffer layer 102 and covers the active layer 108. Next, a metal film is deposited on the gate insulating layer 106 by a method such as a sputtering process. The metal film is then patterned by an etching process and defines a gate electrode 110.

The gate electrode 110 is used as an ion-blocking mask while the entire surface of the structure is heavily doped with N type or P type impurities 112. The doping process creates an active layer 108 on each side of the gate electrode 110, thus forming an impurity region 108a. The region 108a will be used later as a source/drain region.

Referring to FIG. 1B, after a first protective layer 120 is formed on the gate insulating layer 106, a first contact hole h1 is formed, which leaves the source/drain region 108a exposed. The first contact hole h1, formed within the first protective layer 120, will be used as an electrical passage that connects the source/drain region 108a to a source/drain electrode 122.

The source/drain electrode 122 is formed by depositing a metal film on the first protective layer 120 and patterning the metal film via an etching process so that the patterned metal film covers the first contact hole h1. Note that the metal film is usually made of aluminum.

Referring to FIG. 1C, a second protective layer 124 is formed so as to cover the entire surface of the structure. A second contact hole h2 is now created which exposes the source/drain electrode 122. This second contact hole h2, formed within the second protective layer 124, will be used as a passage for electrically connecting the source/drain electrode 122 and a metal connector line 126.

The metal connector line 126 is formed by depositing an ITO on the second protective layer 124 and then patterning the ITO via an etching process so that the patterned ITO covers the second contact hole h2. By this process, the metal connector line 126 is now connected to the source/drain electrode 122.

As described above, the ITO is deposited directly on the source/drain electrode 122. Further, the ITO penetrates into the material forming the source/drain electrode due to the heat generated during the deposition process. However, this penetration results in the galvanic phenomenon occurring.

Additionally, the related art process tries to control the extent of the galvanic phenomenon by minimizing the contact area between the source/drain electrode and the metal connector line. Minimizing the contact area requires that the protective layer and the contact hole be formed in two steps. However, a two-step process results in an extremely complex manufacturing process and significantly increases the time and expense required for manufacturing the liquid crystal display device.

SUMMARY OF THE INVENTION

To overcome the problems described above, preferred embodiments of the present invention provide a thin film transistor and a method of forming a thin film transistor in which a galvanic phenomenon is prevented without requiring additional etching steps.

According to one preferred embodiment of the present invention, a method for manufacturing a thin film transistor includes providing a substrate including a source/drain electrode and a connector line and forming a metal oxide layer between the source/drain electrode and the connector line.

According to another preferred embodiment of the present invention, a method for manufacturing a thin film transistor having a source/drain electrode on an insulating substrate includes forming a conductive layer to cover the source/drain electrode, heat treating the conductive layer in an oxygen atmosphere to form a metal oxide layer and forming a metal connector line on the metal oxide layer such that the metal connector line and the source/drain electrode are connected via the metal oxide layer.

According to another preferred embodiment of the present invention, a method for manufacturing a thin film transistor having a source/drain electrode on an insulating substrate includes forming a data line on an insulating substrate, the data line being provided with a source electrode, forming an interlevel insulating layer on the insulating substrate so as to cover the data line, forming an active layer on the interlevel insulating layer, depositing a gate insulating layer on the active layer to form a gate electrode, selectively doping the active layer with impurities to form a source/drain region, forming a protective layer so to cover the interlevel layer, the active layer and the gate insulating layer, etching the gate insulating layer and the protective layer so as to expose the source electrode and the source/drain region, forming a conductive layer on the interlevel layer, the active layer, the gate insulating layer, the protective layer, the source electrode and the source/drain region, heat treating the conductive layer in an oxygen atmosphere to form a metal oxide layer, and forming a metal connector line on the metal oxide layer.

Another preferred embodiment provides a thin film transistor which includes an insulating substrate, a source/drain electrode on the insulating substrate, and a conductive layer that covers at least the source/drain electrode, and which defines a metal oxide layer after being heat treated.

In the invention, the thin film transistor has an insulating substrate, a source/drain electrode over a source/drain active region on a supporting surface of the insulating substrate, and a protective layer over the portions or the source/drain active region and a gate. The protective layer has via holes through which the source/drain electrode extends. A conductive layer covers the source/drain electrode and the supporting surface of the insulating substrate, and the conductive layer includes a metal oxide layer entirely covering the source drain electrode and entirely covering an upper surface of the protective layer. A metal connector line is formed on the metal oxide layer such that the metal connector line and the source/drain electrode are connected via the metal oxide layer.

Various other features, elements, and advantages of the present invention will be readily appreciated as the same becomes better understood with reference to the following detailed description of preferred embodiments when considered in connection with accompanying drawings.

BRIEF DESCRIPTION OF THE ATTACHED DRAWINGS

The present invention will become more fully understood from the detailed description given herein below and the accompanying drawings which are given by way of illustration only, and thus do not limit the present invention and wherein:

FIGS. 2A–2D are cross-sectional views illustrating a process for manufacturing a liquid crystal display apparatus according to a preferred embodiment of the present invention, where the preferred embodiment is applied to a coplanar structure;

Figure 3A:
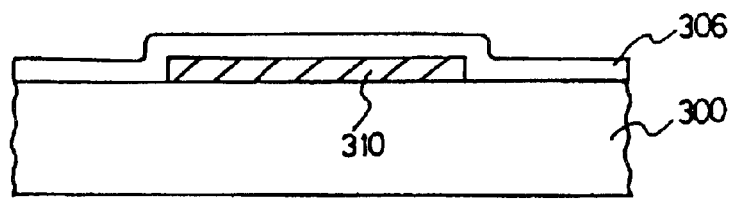
Figure 3B:
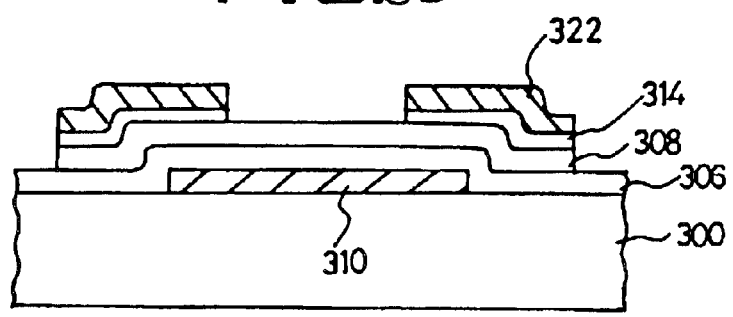
Figure 3C:
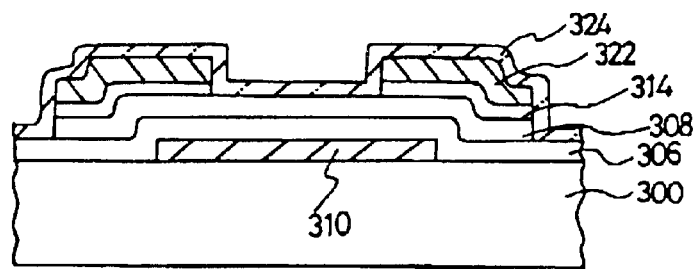
Figure 3D:
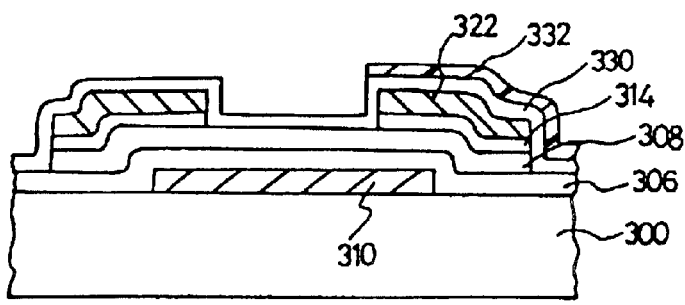
Figure 4A:
Figure 4A:
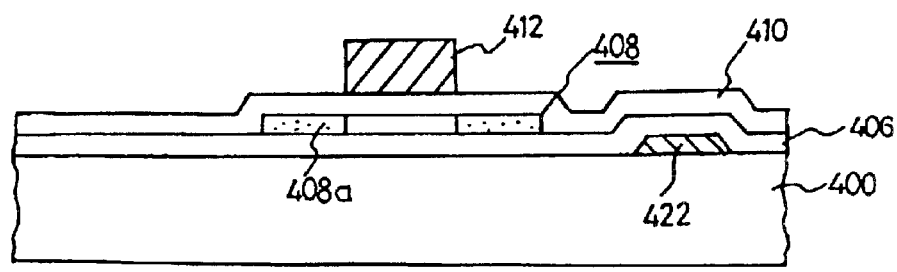
Figure 4B:
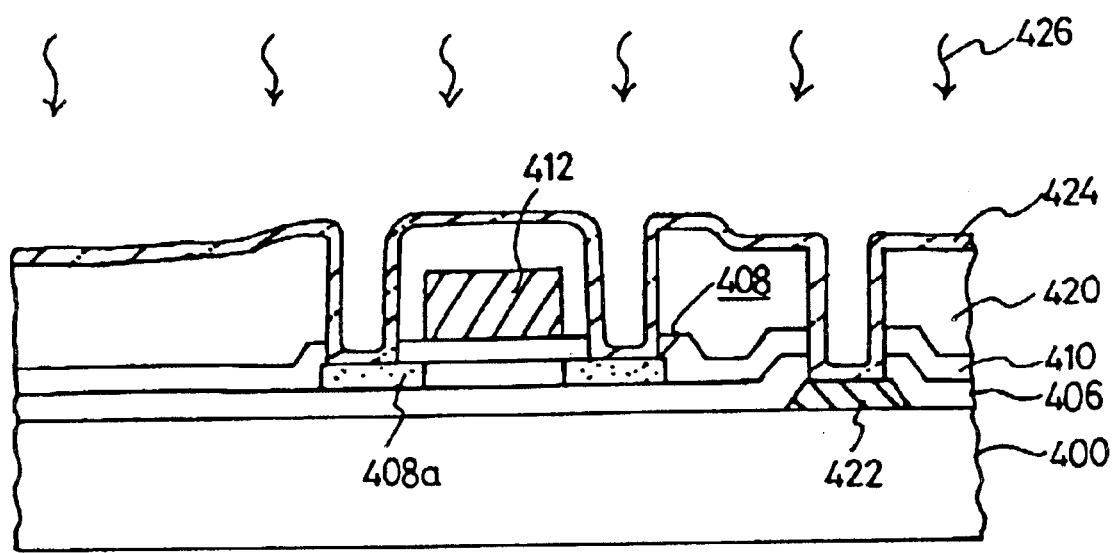
Figure 4C:
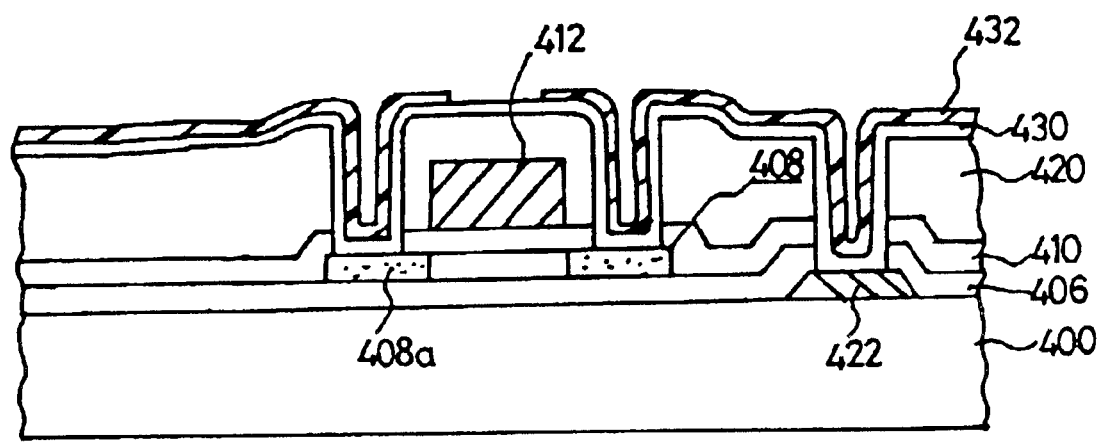

FIGS. 3A–3D are cross-sectional views illustrating a process for manufacturing a liquid crystal display apparatus according to another preferred embodiment of the present invention, where the preferred embodiment is applied to a reverse-staggered structure; and FIGS. 4A–4C are cross-sectional views illustrating a process for manufacturing a liquid crystal display apparatus according to another preferred embodiment of the present invention, where the preferred embodiment is applied to a BBC (Buried Bus Coplanar) structure.

DETAILED DESCRIPTION OF PREFERRED EMBODIMENTS

FIGS. 2A–2D are cross-sectional views illustrating a process for manufacturing a liquid crystal display apparatus according to a preferred embodiment of the present invention, where this preferred embodiment is applied to a coplanar structure.

Referring to FIG. 2A, a buffer layer 202 is formed on an insulating substrate 200 such as glass. Polysilicon is then deposited on the buffer layer 202 preferably via chemical vapor deposition (CVD) and patterned preferably via an etching process to form an active layer 208. Alternatively, instead of using polysilicon, the active layer 208 may be formed by crystallizing amorphous silicon. The buffer layer 202 is formed to prevent the silicon component of the polysilicon from diffusing into the insulating substrate 200 when it is deposited on the substrate 200.

Next, a gate insulating layer 206 is formed on the insulating layer 200 and covers the active layer 208. Thereafter, a metal such as aluminum (Al) or molybdenum (Mo) or other suitable metal is deposited preferably via a sputtering method to form a metal film on the gate insulating layer 206. The metal film is used to form a gate electrode 212.

Using the gate electrode 212 as an ion-blocking mask, N type or P type impurity ions 214 are used to heavily dope the entire surface of the structure. Note that the energy intensity of the dopants 214 preferably varies depending upon the thickness of the gate insulating layer 206. After the doping, on each side of the gate electrode 212, there exists an impurity region 208a within the active layer 208. This impurity region 208a is used as a source/drain region.

Referring to FIG. 2B, after a first protective layer 220 is formed on the gate insulating layer 206, a contact hole C1 is formed and exposes the source/drain region 208a. Thereafter, a source/drain electrode 222 is formed on the protective layer 220. The source/drain electrode 222 is created by depositing a metal such as aluminum or molybdenum or other suitable metal preferably via the sputtering method and then patterning the deposited metal. The source/drain electrode 222 covers the contact hole C1 and is in contact with the source/drain region 208a.

Referring to FIG. 2C, a conductive layer 224 is formed on the protective layer 220 and covers the source/drain electrode 222. The types of metals commonly used for the conductive layer 224 includes titanium (Ti), indium (In), and zinc (Zn), but may include other suitable conductive materials. Next, the conductive layer 224 undergoes a heat treatment 226 in which the heating temperature is preferably less than about 300° C.

Figure 1A:
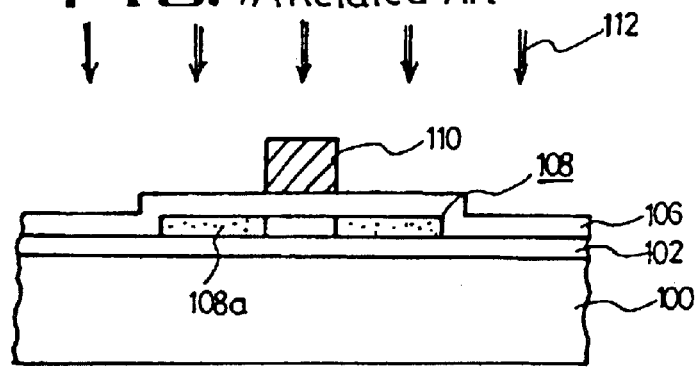
FIGS. 1A–1C are cross-sectional views illustrating a process for manufacturing a liquid crystal display apparatus according to the related art.
Figure 1B:
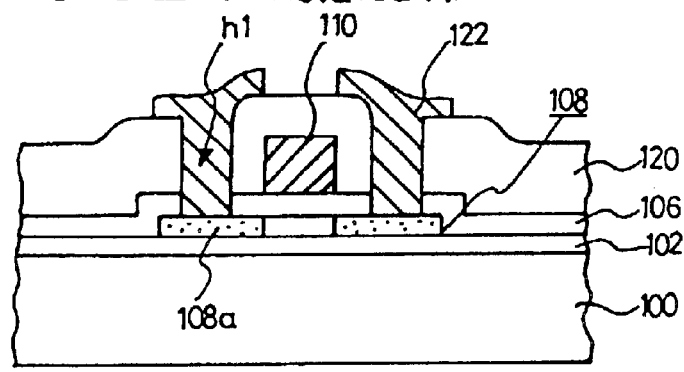
Figure 1C:
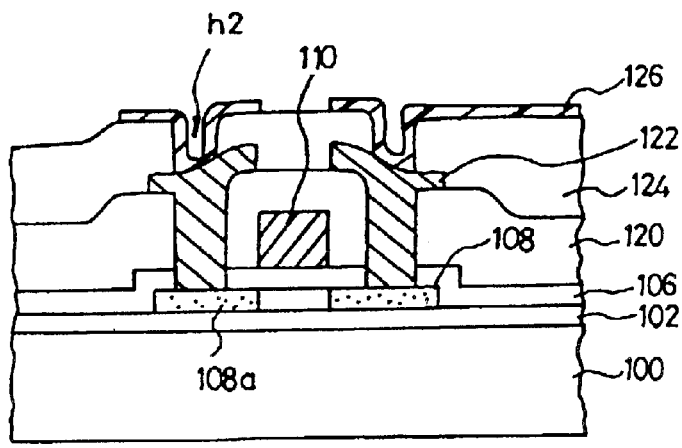
Figure 2D:
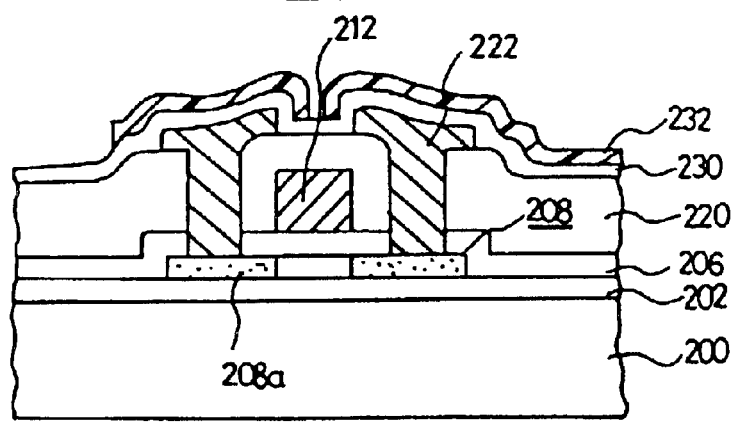

Referring now to FIG. 2D, as the heat treatment progresses, the conductive layer is oxidized and becomes a metal oxide layer 230. The metal oxide layer 230 is transparent and remains conductive with good optical transmittance. Note that it is preferable to perform the oxidation process in a controlled environment. For example, if the conductive layer 224 is formed of titanium, titanium reacts with oxygen in the air or in the surrounding atmosphere to produce titanium oxide ($TiO_x$), which may be TiO, $TiO_2$ or $TiO_3$ depending on such variables as temperature, duration of oxidation, atmosphere, etc. Titanium is itself opaque, but only TiO is transparent while $TiO_2$ and $TiO_3$ are not. In preferred embodiments of the present invention, it is preferable to form TiO so that the metal oxide layer is transparent and conductive. Thus, the oxidation process is preferably to be controlled to produce TiO.

Still referring to FIG. 2D, an ITO is now deposited on the metal oxide layer 230 and then patterned preferably via an etching process so that an electrical connection with the source/drain electrode 222 is created. Thus, the ITO forms a metal connector line 232 which is connected to the source/drain electrode 222 and the source/drain region 208a through the metal oxide layer 230.

An interesting property of the metal oxide layer 230 is that it is conductive at a portion which corresponds to a position of the source/drain electrode 222 and insulative at a portion which corresponds to a position of the insulating layer 206. As a result, the present preferred embodiment of the present invention does not require a separate etching process due to the above properties. Additionally, the metal oxide layer 230 is sufficiently transparent so that the underlying source/drain electrode 222 is shown, and thus, there is no need for a photo-etching process to remove the metal oxide layer 230. Further, the galvanic phenomenon does not occur because the metal connector line 232 is not in direct contact with the source/drain electrode 222.

A variation of the preferred embodiment described above method involves patterning the ITO and the metal oxide layer 230 preferably via a simultaneous etching process which includes the use of a photo-mask for patterning the metal connector line 232 while the metal connector line 232 is being formed.

FIGS. 3A–3D are cross-sectional views illustrating a process for manufacturing a liquid crystal display apparatus according to another preferred embodiment of the present invention, wherein this preferred embodiment is applied to a reverse staggered structure.

Referring to FIG. 3A, a metal such as aluminum is sputtered on an insulating substrate 300 such as glass. The sputtered metal is then patterned preferably via an etching process to form a gate electrode 310. A gate insulating layer 306 is then deposited on the insulating substrate 300 so as to cover the gate electrode 310.

Referring to FIG. 3B, an amorphous silicon layer and a metal layer are sequentially formed on the gate insulating layer 306. The amorphous silicon layer and the metal layer are then patterned preferably via an etching process to form an active layer 308 and a source/drain electrode 322. The patterning step also exposes a select portion of the gate electrode 310. Note that reference numeral 314 denotes an ohmic contact layer 314 interposed between the active layer 308 and the source/drain electrode 322.

Referring to FIG. 3C, a conductive layer 324 is formed on the structure and undergoes a heat treatment 326 in which the heating temperature is preferably less than about 300° C. During the heat treatment 326, the conductive layer 324 is exposed to the air or to the oxygen in the surrounding atmosphere. Note that in this preferred embodiment, a metal such as titanium (Ti), indium (In) or zinc (Zn) or other suitable metal is used for forming the conductive layer 324.

Referring now to FIG. 3D, as the heat treatment progresses, the conductive layer is oxidized into a metal oxide layer 330. Thereafter, a metal connector line 332 preferably made of ITO is formed on the metal oxide layer 330. The metal oxide layer 330 is transparent and remains conductive. Thus, the metal connector line 332 is now electrically connected to the source/drain electrode 322 through the metal oxide layer 330.

Because the metal oxide layer is transparent with excellent optical transmittance, it is possible to form the metal connector line 332 directly on the metal oxide layer 330 without performing a separate etching process. Similarly, the metal oxide layer 330 can be patterned while forming the metal connector line 332.

FIGS. 4A–4C are cross-sectional views illustrating a process for manufacturing a liquid crystal display apparatus according to another preferred embodiment of the present invention, wherein this preferred embodiment is applied to a BBC structure.

Referring to FIG. 4A, a data line (not shown) provided with a source electrode 422 is formed on an insulating substrate 400 such as glass. Next, silicon oxide is preferably deposited on the insulating layer 400 so as to cover the data line, and the deposited silicon oxide forms an interlevel insulating layer 406.

Thereafter, amorphous silicon is deposited on the interlevel insulating layer 406 and then crystallized using laser radiation. The crystallized silicon layer is then patterned preferably via an etching process such that the remaining portion of the crystallized silicon layer forms an active layer 408.

Thereafter, a gate insulating layer 410 is deposited on the interlevel insulating layer 406 and covers the active layer 408. Then a gate line (not shown) which is provided with a gate electrode 412 is formed on the gate insulating layer 410. Using the gate electrode 412 as an ion-blocking mask, the entire surface of the structure is heavily doped with N type or P type impurities 414. During this process, a source/drain region 408a is created on each side of the gate electrode 412. Note that the source/drain region 408a is an impurity region within the active layer 408.

Referring to FIG. 4B, a protective layer 420 is formed on the gate insulating layer 410. Thereafter, a contact hole is formed, which exposes the source electrode 422 and the source/drain region 408a. Next, a conductive layer 424 is created on the protective layer 420 so as to cover the contact hole. As stated previously, preferred embodiments of the present invention use a metal such as titanium (Ti), indium (In) or zinc (Zn) or other suitable metal for forming the conductive layer 424. The conductive layer 424 now undergoes a heat treatment 426 wherein the heating temperature is preferably less than about 300° C. During the heat treatment, the conductive layer 424 is exposed to air or oxygen in the surrounding atmosphere.

Referring now to FIG. 4C, as the heat treatment progresses, the conductive layer becomes oxidized and turns into a metal oxide layer 430. Thereafter, a metal connector line 432 is formed of ITO on the metal oxide layer 430. Note that the metal oxide layer 430 is transparent and remains conductive. Further, the transparency of the metal oxide layer 430 should be sufficient to permit the underlying layer to be shown, and it also should have excellent optical transmittance.

Additionally, because the metal oxide layer 430 exhibits the dual property of being conductive at portions covering the source electrode 422 and the source/drain region 408a while also being insulative at those portions covering the protective layer 420, it is possible to form the metal connector line 432 without a separate etching process. Similarly, the metal oxide layer 430 can be patterned simultaneously with the metal connector line 432 while the metal connector line 432 is being formed.

As described above, preferred embodiments of the present invention prevent the galvanic phenomenon from occurring without requiring an additional masking process by interposing a metal oxide layer between the source/drain electrode and the metal connector line. Furthermore, the metal oxide layer is transparent and remains conductive, and therefore does not need to be separately etched while forming the metal connector line. This eliminates the need to photo-etch the metal oxide layer, and thus simplifies the entire manufacturing process.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for manufacturing a thin film transistor, wherein the thin film transistor has a source/drain electrode on an insulating substrate, comprising the steps of:

forming a conductive layer to cover the source/drain electrode;

heat treating the conductive layer in an oxygen atmosphere to form a metal oxide layer; and forming a metal connector line on the metal oxide layer such that the metal connector line and the source/drain electrode are connected via the metal oxide layer, and the metal oxide layer is conductive over the source/drain electrode and the metal oxide layer is insulative over a gate insulating layer that exposes the source/drain electrode, wherein the metal oxide layer does not require a separate etching process.

2. The method according to claim 1, wherein the heat treating step is performed at a temperature less than about 300° C.

3. The method according to claim 1, wherein the heat treating step is performed while exposing the thin film transistor to air.

4. The method according to claim 1, wherein the step of forming the metal connector line further includes the step of a simultaneous etching process using a photo mask to pattern the metal oxide layer while forming the metal connector line.

5. The method according to claim 1, wherein the metal oxide layer is transparent.

6. A method for manufacturing a liquid crystal display comprising the steps of:

forming a data line on an insulating substrate, the data line being provided with a source electrode;

forming an interlevel insulating layer on the insulating substrate so as to cover the data line;

forming an active layer on the interlevel insulating layer;

depositing a gate insulating layer on the active layer;

forming a gate electrode over the gate insulating layer;

selectively doping the active layer with impurities to form a source/drain region;

forming a protective layer so to cover the interlevel layer, the active layer and the gate insulating layer;

etching the interlevel insulating layer, the gate insulating layer and the protective layer so as to expose the source electrode and the source/drain region;

forming a conductive layer on the interlevel layer, the active layer, the gate insulating layer, the protective layer, the source electrode and the source/drain region;

heat treating the conductive layer in an oxygen atmosphere to form a metal oxide layer; and forming a metal connector line on the metal oxide layer.

7. The method as claimed in claim 6, wherein the heat treating step is performed at a temperature of less than about 300° C.

8. The method as claimed in claim 6, wherein the step of forming the metal connector line further includes the step of a simultaneous etching process using a photo mask to pattern the metal oxide layer while forming the metal connector line.

9. A method of forming a liquid crystal display apparatus, comprising the steps of:

providing a substrate;

forming a source/drain electrode and a connector line over the substrate; and forming a metal oxide layer between the source/drain electrode and the connector line, and the metal oxide layer is conductive over the source/drain electrode and the metal oxide layer is insulative over an insulating layer, wherein the metal oxide layer does not require a separate etching process.

10. The method according to claim 9, wherein the metal oxide layer is formed to prevent the source/drain electrode from contacting the connector line.

11. The method according to claim 9, wherein the metal oxide layer is formed such that the connector line and the source/drain electrode are connected via the metal oxide layer.

12. The method according to claim 9, wherein the step of forming the metal oxide layer includes the steps of forming a conductive layer to cover the source/drain electrode and heat treating the conductive layer in an oxygen atmosphere to form a metal oxide layer.

13. The method according to claim 12, wherein the heat treating step is performed at a temperature less than about 300° C.

14. The method according to claim 12, wherein the heat treating step is performed while exposing the thin film transistor to air.

15. The method according to claim 9, wherein the connector line is formed such that simultaneous etching using a photo mask is performed to pattern the metal oxide layer while forming the connector line.

16. The method according to claim 9, wherein the metal oxide layer is transparent.

* * * * *